United States Patent
Lin et al.

(10) Patent No.: US 6,737,339 B2
(45) Date of Patent: May 18, 2004

(54) SEMICONDUCTOR DEVICE HAVING A DOPED LATTICE MATCHING LAYER AND A METHOD OF MANUFACTURE THEREFOR

(75) Inventors: Wen Lin, Allentown, PA (US); Charles W. Pearce, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/003,873

(22) Filed: Oct. 24, 2001

(65) Prior Publication Data

US 2003/0077884 A1 Apr. 24, 2003

(51) Int. Cl.$^7$ ................ H01L 21/20; H01L 21/36
(52) U.S. Cl. .............. 438/491; 438/491; 438/495; 438/499; 117/94
(58) Field of Search ............. 438/491, 495, 438/499, 505, 508, 761, FOR 302, FOR 291, FOR 314, FOR 292, FOR 293, FOR 393, FOR 394, FOR 400, 87, 94, 285, 492; 427/255.8; 257/376, 385, 386, 400; 117/94

(56) References Cited

U.S. PATENT DOCUMENTS 4,378,259 A * 3/1983 Hasegawa et al. ........... 438/33

* cited by examiner

*Primary Examiner*—George Fourson
*Assistant Examiner*—Julio J. Maldonado (57) ABSTRACT

The present invention provides a semiconductor device, a method of manufacture therefor, and an integrated circuit including the same. The semiconductor device may include a doped buried layer located over a doped substrate and a doped epitaxial layer located over the doped buried layer. The semiconductor device may further include a first doped lattice matching layer located between the substrate and the buried layer and a second doped lattice matching layer located between the doped buried layer and the doped epitaxial layer.

8 Claims, 8 Drawing Sheets

SEMICONDUCTOR DEVICE HAVING A DOPED LATTICE MATCHING LAYER AND A METHOD OF MANUFACTURE THEREFOR

TECHNICAL FIELD OF THE INVENTION

The present invention is directed, in general, to a semiconductor device and, more specifically, to a semiconductor device having a doped lattice matching layer, a method of manufacture therefor and an integrated circuit including the same.

BACKGROUND OF THE INVENTION

The advent of the integrated circuit has had a significant impact on various types of communication devices. The integrated circuit has been incorporated into both radio frequency applications and high speed communication network systems. While operation speeds of these communication devices have dramatically increased, the demand for yet faster communication devices continues to rise. Thus, the semiconductor manufacturing industry continually strives to increase the overall speed of the integrated circuit.

One way in which the semiconductor industry has increased the speed of the integrated circuit is to continue to shrink the size of the transistor. Over the last few years, the device size of the transistor has gone from 0.5 $\mu$m to 0.32 $\mu$m to 0.25 $\mu$m and now transistor device sizes are heading to the 0.10 $\mu$m range and below. With each decrease in size, however, the semiconductor industry has faced new challenges.

One of such challenges is that of reducing parasitic capacitance. As transistor geometries shrink, the time delay of signals propagating through the transistor are heavily influenced by the various parasitic capacitances inevitably associated with the structure, when fabricated according to the current state of the art. One of the principal remaining elements of transistor capacitance is the source-drain to substrate capacitance. This junction capacitance, as a function of area, is increasing as the technology advances. This is in part because one of the principal known failure mechanisms of a short channel transistor is controlled through the use of increased well doping. However, increased well doping reduces the diode depletion layer thickness in the well, which increases unit capacitance.

Another challenge is reducing "cross-talk." As is well known, cross-talk results when electrical noise, created by transistor devices, travels through the capacitive coupling of the substrate and negatively affects the performance of other devices on the chip. Though cross-talk has been a well-known phenomenon, up until recently it was of less concern. However, as a result of the use of multi-gigahertz operating frequencies in today's RF devices, the significance of cross-talk has increased dramatically. In addition, with the increase in packing density and decrease in device size, transistor devices are being manufactured on the same chip and closer and closer together, which increases the relative magnitude of the cross-talk problem. Thus, as a result of the increased packing density and the decreased device sizes, both taken in conjunction with the cross-talk problem, device performance and integration issues are becoming increasingly problematic.

The semiconductor manufacturing industry currently attempts to provide a solution to these problems by positioning a highly doped buried layer between the epitaxial silicon layer and the bulk substrate. However, current manufacturing processes for the highly doped buried layer require the use of a very high dose ion implantation, as well as a high current implanter and very high thermal budget. The use of the very high dose ion implantation generally leads to high stress at the bulk substrate-epitaxial silicon layer interface.

The high stress at the bulk substrate-epitaxial silicon layer interface also results in misfit dislocation formation and defects at interface. The vast differences in dopant concentration and lattice size between the buried layer and the epitaxial silicon layer, generally results in the above identified problems. For example, it is known that adding boron to silicon causes lattice contraction, many times at a rate of 0.014 Angstroms/atomic % boron. The interfacial lattice mismatch may then, in the presence of the high temperatures required to complete the semiconductor device, turns into mobile extended lattice defects.

Accordingly, what is needed in the art is a semiconductor device that experiences many of the benefits associated with using the diffused buried layer, without the aforementioned drawbacks.

SUMMARY OF THE INVENTION

To address the above-discussed deficiencies of the prior art, the present invention provides a semiconductor device and an integrated circuit including the same. The semiconductor device may include a doped buried layer located over a doped substrate and a doped epitaxial layer located over the doped buried layer. The semiconductor device may further include a first doped lattice matching layer located between the doped substrate and the doped buried layer, and a second doped lattice matching layer located between the doped buried layer and the doped epitaxial layer.

The present invention further provides a method of manufacturing a semiconductor device. The method may include forming a first doped lattice matching layer over a doped substrate, creating a doped buried layer over the first doped lattice matching layer, producing a second doped lattice matching layer over the doped buried layer, and placing a doped epitaxial layer over the second doped lattice matching layer. In one advantageous embodiment, the first doped lattice matching layer, doped buried layer, second doped lattice matching layer, and the doped epitaxial layer are formed using a chemical vapor deposition process, all of which may be performed in a single deposition chamber.

The present invention additionally provides an alternative semiconductor device, method of manufacture therefor, and an integrated circuit including the same. The semiconductor device, in one embodiment, may comprise a co-doped germanium buried layer located over a doped substrate, and a doped epitaxial layer located over the co-doped germanium buried layer.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

The invention is best understood from the following detailed description when read with the accompanying FIG- UREs. It is emphasized that in accordance with the standard practice in the semiconductor industry, various features are not drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 1:
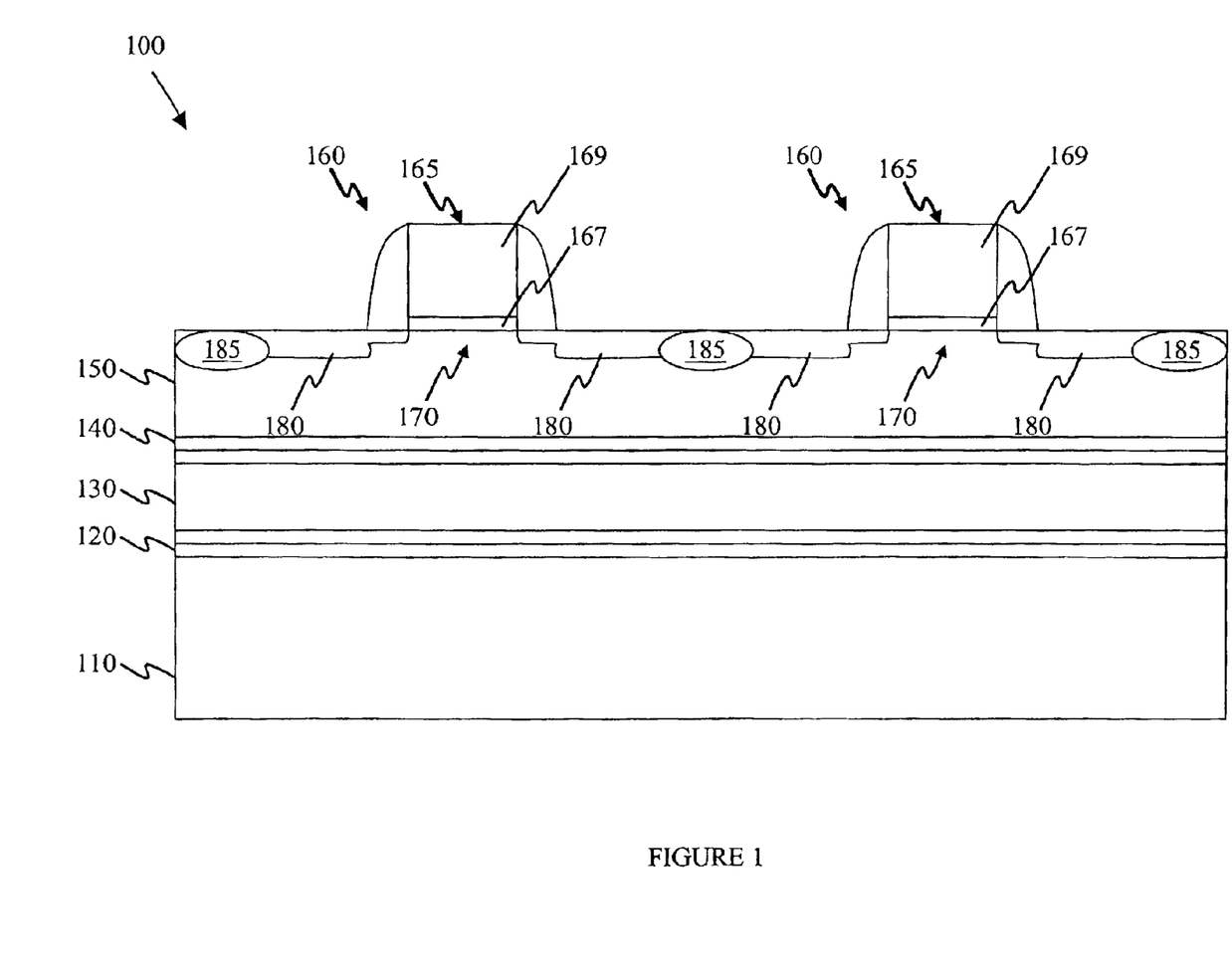
FIG. 1 illustrates one embodiment of a semiconductor device, constructed in accordance with the principles of the present invention.

Referring initially to FIG. 1 illustrated is one embodiment of a semiconductor device, generally designated 100, constructed in accordance with the principles of the present invention. In the illustrative embodiment shown in FIG. 1, the semiconductor device 100 includes a doped buried layer 130 located over a doped substrate 110. The doped substrate 110 may be any layer located in an integrated circuit, including a layer located at the wafer level or above. The semiconductor device 100 may further include a doped epitaxial layer 150 located over the doped buried layer 130.

Also located within the semiconductor device 100 are a first doped lattice matching layer 120 and a second doped lattice matching layer 140. As used herein, the term "doped lattice matching layer" refers to a layer whose crystalline structure substantially matches the crystalline structure on which it lays, such that lattice defects between the layers are substantially reduced. It should be noted that many of the lattice defects arise because of lattice mismatch between the various layers.

In the illustrative embodiment shown, the first doped lattice matching layer 120 is located between the doped substrate 110 and the doped buried layer 130. Additionally, as shown, the second doped lattice matching layer 140 is located between the doped buried layer 130 and the doped epitaxial layer 150. It should be noted that first and second doped lattice matching layers 120, 140 may be single layers, or multiple layers as illustrated.

In one advantageous embodiment of the present invention, the first doped lattice matching layer 120 may have a first dopant concentration that is less than a dopant concentration of the doped buried layer 130, however, more than a dopant concentration of the doped substrate 110. Likewise, the second doped lattice matching layer 140 may have a second dopant concentration that is less than a dopant concentration of the doped buried layer 130, however, more than a dopant concentration of the doped epitaxial layer 150. The first and second dopant concentrations need not be equal to one another, however, in one advantageous embodiment they are.

Located over the doped epitaxial layer 150 are conventional transistors 160. In the illustrative embodiment shown in FIG. 1, each of the transistors 160 includes a transistor gate 165, having a gate oxide 167 and a gate electrode 169. The transistors 160 may further include a channel region 170 located in the doped epitaxial layer 150. Additionally, the transistors 160 may include source/drain regions 180. Located between the transistors 160 are conventional isolation structures 185. While transistors have been shown, it should be understood that the scope of the present invention is applicable with any other type of semiconductor devices that benefit from doped buried layers.

The placement and use of the first and second doped lattice matching layers 120, 140, as well as the decrease in dopant concentration from the doped buried layer 130 to the first and second lattice matching layers 120, 140, helps to reduce lattice mismatch between the doped substrate 110 and the doped buried layer 130, as well as between the doped buried layer 130 and the epitaxial layer 150. This reduction in the lattice mismatch helps produce a semiconductor device 100 that does not experience many of the problems experienced by the prior art devices. More specifically, the first and second lattice matching layers 120, 140 help provide a semiconductor device that is more robust and reliable than the prior art devices.

Figure 2:
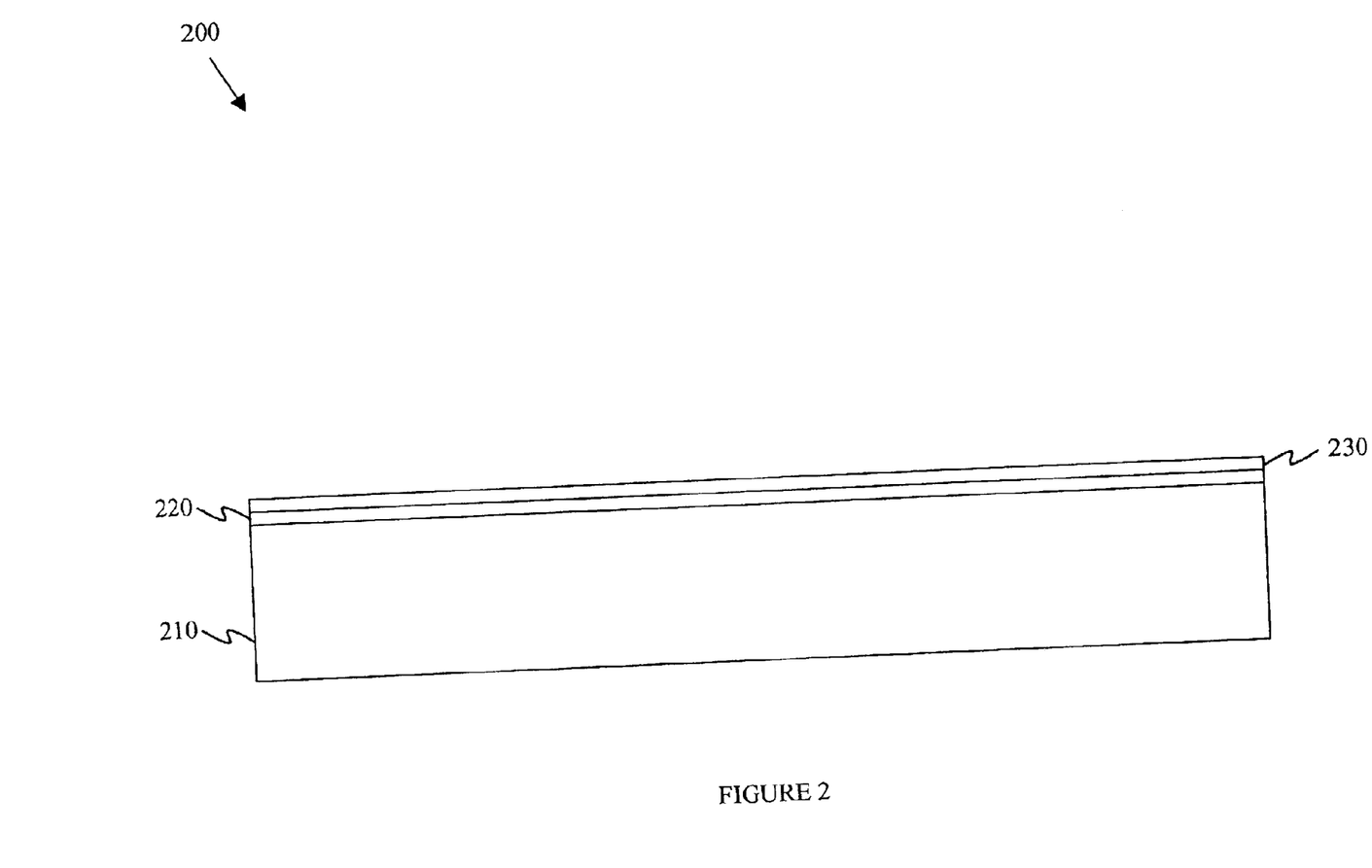
FIG. 2 illustrates a cross-sectional view of a partially completed semiconductor device, which is in accordance with the principles of the present invention.

Turning now to FIGS. 2–6, illustrated are detailed steps illustrating how a semiconductor device, similar to the semiconductor devices 100 shown in FIG. 1, might be manufactured. Turning to FIG. 2, illustrated is a cross-sectional view of a partially completed semiconductor device 200, which is in accordance with the principles of the present invention. In the illustrative embodiment shown in FIG. 2, the semiconductor device 200 includes a first doped lattice matching layer 220 formed over a doped substrate 210.

As previously recited, the doped substrate 210 may be any layer located in an integrated circuit, including a layer located at the wafer level or above. The doped substrate 210, in an exemplary embodiment, may include a p-type dopant, such as boron. In an alternative embodiment, however, the doped substrate 210 could be doped with an n-type dopant. In such an embodiment, all of the dopant types described herein, would typically then be reversed.

In one advantageous embodiment, the doped substrate 210 is doped to a concentration ranging from about 1E14 atoms/cm$^3$ to about 1E15 atoms/cm$^3$, with a preferred value being about 5E14 atoms/cm$^3$. One skilled in the art understands how to form the doped substrate 210, including forming a doped silicon ingot and cutting the doped substrate 210 therefrom. Because the doped substrate 210 may be formed using many conventional methods, no further discussion is warranted.

As discussed above, formed over the doped substrate 210 is the first doped lattice matching layer 220. The first doped lattice matching layer 220, which is preferably silicon, may be formed using any known or hereafter discovered process. However, in the illustrative embodiment shown in FIG. 2, the first doped lattice matching layer 220 is formed using a chemical vapor deposition (CVD) process. In an exemplary embodiment, the CVD process is conducted at a temperature ranging from about 950° C. to about 1150° C. and a deposition rate ranging from about 0.1 μm/min to about 0.5 μm/min. Various other manufacturing ranges are, however, within the scope of the present invention. Additionally, the first doped lattice matching layer 220 may be formed having various thicknesses. For example, a thickness of the first doped lattice matching layer 220 ranging from about 0.1 μm to about 0.3 μm may be particularly beneficial.

The first doped lattice matching layer 220 may have a variety of dopant concentrations, however, the dopant concentration of the first doped lattice matching layer 220 should generally be greater than the dopant concentration of the doped substrate 210. For example, when the doped substrate 210 has a dopant concentration ranging from about 1E14 atoms/cm$^3$ to about 1E15 atoms/cm$^3$, the first doped lattice matching layer 220 could have a dopant concentration ranging from about 1E15 atoms/cm$^3$ to about 1E19 atoms/cm$^3$, and preferably a dopant concentration of about 1E17 atoms/cm$^3$. While specific dopant concentrations have been given for both the doped substrate 210 and the first doped lattice matching layer 220, the dopant concentrations may vary without departing from the scope of the present invention.

Figure 3:
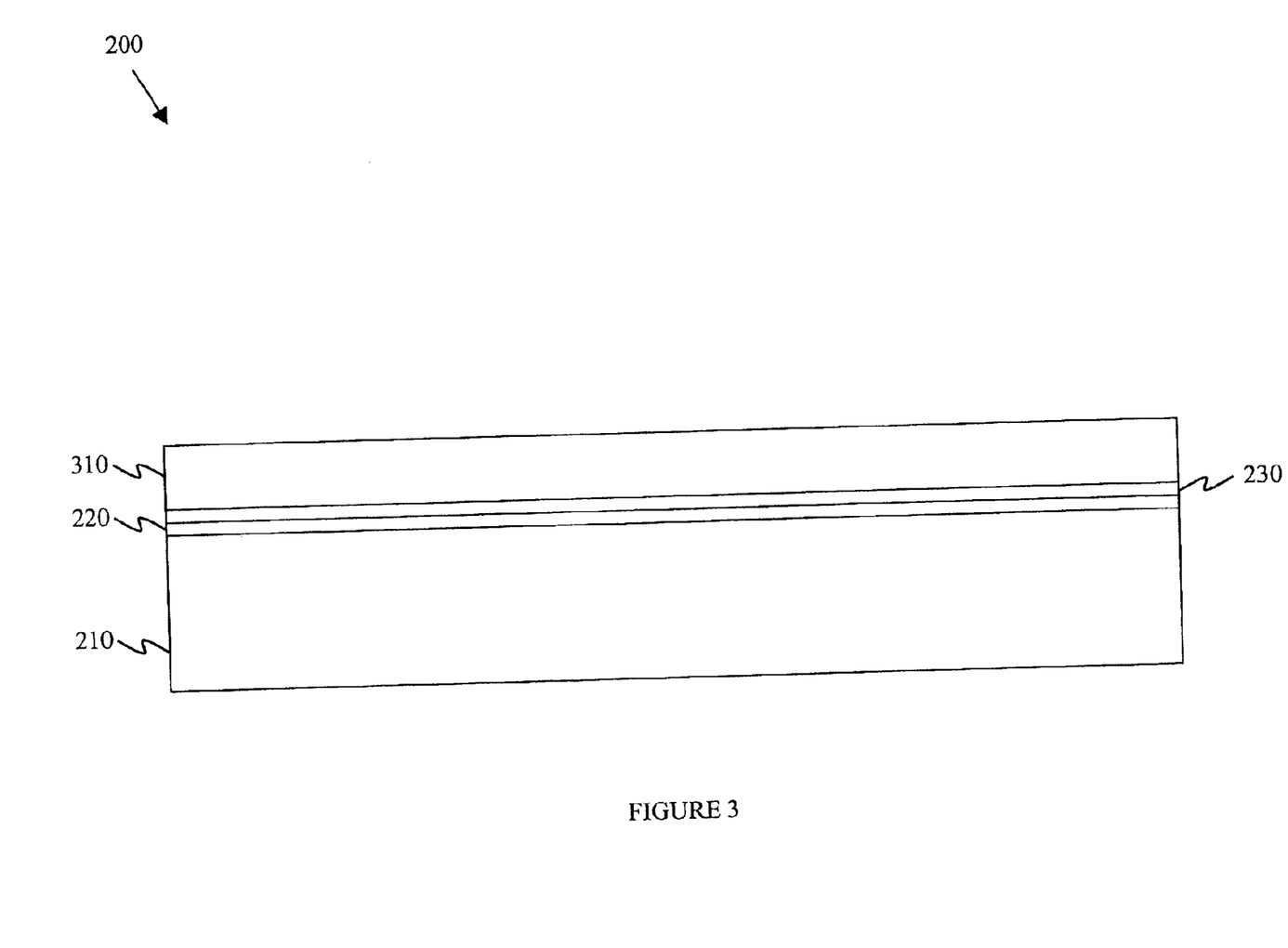
FIG. 3 illustrates a cross-sectional view of the partially completed semiconductor device illustrated in FIG. 2, after formation of a doped buried layer over a doped substrate.

In an alternative embodiment of the present invention, the first doped lattice matching layer 220 has a dopant concentration that is in the form of a dopant gradient. In such an embodiment, a dopant concentration of the dopant gradient would be greater than the dopant concentration of the doped substrate 210. The dopant gradient would typically be formed such that its lowest dopant concentration is adjacent the doped substrate 210 and its highest dopant concentration is adjacent a doped buried layer (FIG. 3). In other words, the dopant concentration would gradually increase going from the doped substrate 210 to the doped buried layer (FIG. 3).

In the illustrative embodiment shown in FIG. 2, a second doped lattice matching layer 230 has been formed over the first doped lattice matching layer 220. The second doped lattice matching layer 230 may be formed using a similar manufacturing process as used to manufacture the first doped lattice matching layer 220. Actually, in one exemplary embodiment, the first doped lattice matching layer 220 and the second doped lattice matching layer 230 are each formed using a CVD process, with each CVD process being conducted in a single deposition chamber. In certain embodiments, the only difference between the two CVD processes is the amount of dopant located within the chamber during each respective process.

If used, the second doped lattice matching layer 230 should have a dopant concentration greater than the dopant concentration of first doped lattice matching layer 220. For example, in an advantageous embodiment, the first doped lattice matching layer 220 could have a dopant concentration of about 1E17 atoms/cm$^3$, and the second doped lattice matching layer could have a dopant concentration ranging from about 1E17 atoms/cm$^3$ to about 1E19 atoms/cm$^3$.

Similar to above, the second doped lattice matching layer 230 may have a thickness ranging from about 0.1 μm to about 0.3 μm. Additionally, the second doped lattice matching layer 230 may have a dopant concentration that is in the form of the dopant gradient. If used, the dopant gradient of the second doped lattice matching layer 230 would typically be formed such that its lowest dopant concentration is adjacent the first doped lattice matching layer 220 and its highest dopant concentration is adjacent a doped buried layer (FIG. 3).

Turning now to FIG. 3, illustrated is a cross-sectional view of the partially completed semiconductor device 200 illustrated in FIG. 2, after formation of a doped buried layer 310 over the doped substrate 210. In the illustrative embodiment shown in FIG. 3, the doped buried layer 310 is formed on the second doped lattice matching layer 230. While the doped buried layer 310 is shown formed on the second doped lattice matching layer 230, other embodiments may be different. For example, if the second doped lattice matching layer 230 were not used, the doped buried layer 310 might be formed on the first doped lattice matching layer 220.

The doped buried layer 310 may be formed using many conventional processes, including a conventional CVD or other similar process. In one exemplary embodiment of the present invention, the doped buried layer 310 is a silicon layer and is formed using the same CVD process as used to form the first and second doped lattice matching layers 220, 230. Even more preferable, the doped buried layer 310 and first and second doped lattice matching layers 220, 230 are formed in a single deposition chamber.

The doped buried layer 310 may also be formed to various thicknesses, including a preferred thickness ranging from about 1 μm to about 10 μm. Additionally, the doped buried layer 310 is preferably formed to have a dopant concentration greater than a dopant concentration of both the first and second doped lattice matching layers 220, 230. For example, in one embodiment, the first doped lattice matching layer 220 may have a dopant concentration of about 1E17 atoms/cm$^3$, the second doped lattice matching layer may have a dopant concentration of about 1E18 atoms/cm$^3$, and the doped buried layer 310 may have a dopant concentration ranging from about 1E19 atoms/cm$^3$ to about 1E20 atoms/cm$^3$. It should be noted that an important feature of present invention that has been described thus far, is that the dopant concentrations gradually increase as they approach the doped buried layer 310.

Figure 4:
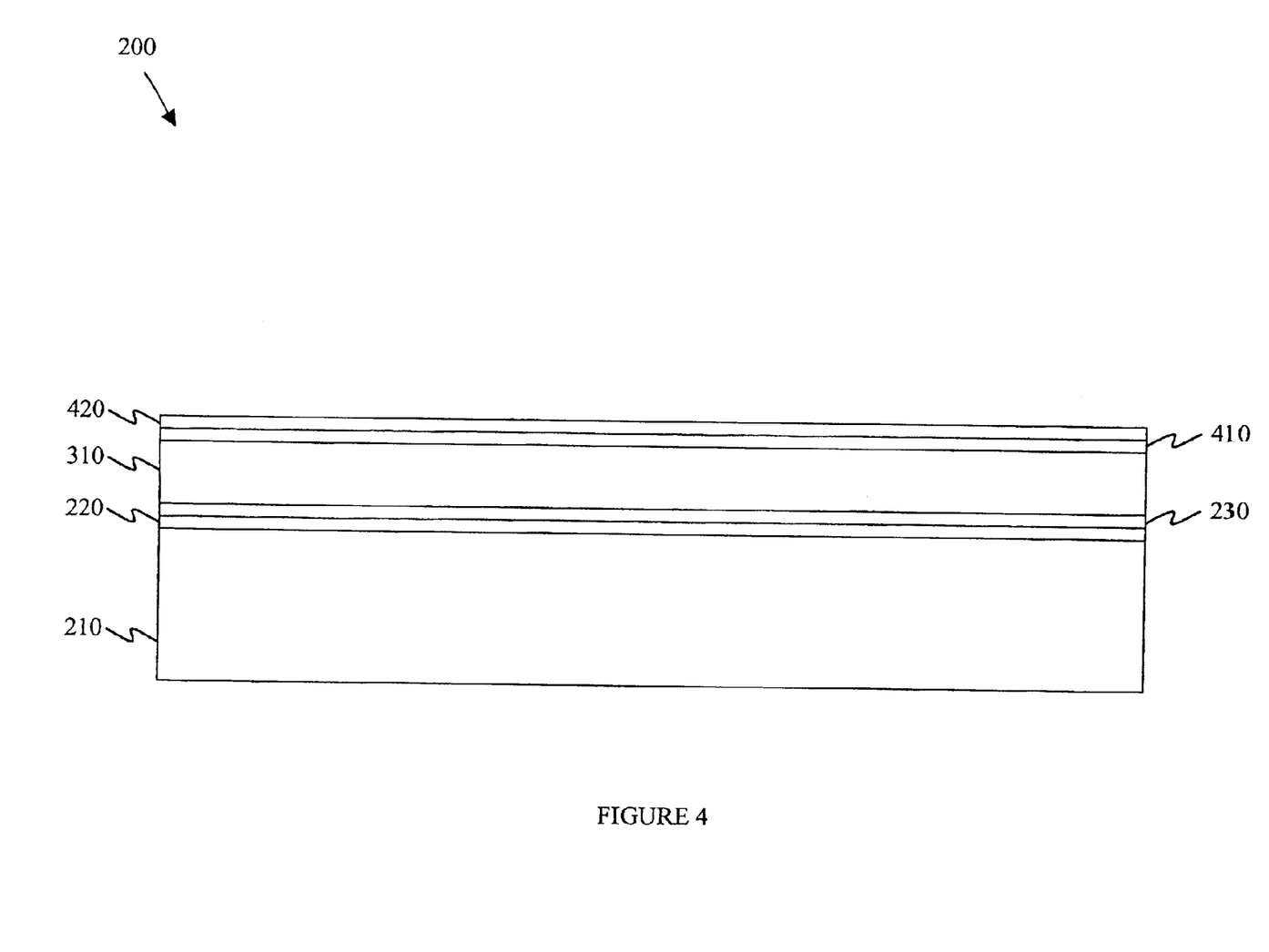
FIG. 4 illustrates a cross-sectional view of the partially completed semiconductor device illustrated in FIG. 3, after formation of a third doped lattice matching layer over the doped buried layer.

Turning to FIG. 4, illustrated is a cross-sectional view of the partially completed semiconductor device 200 illustrated in FIG. 3, after formation of a third doped lattice matching layer 410 over the doped buried layer 310. The third doped lattice matching layer 410 may be formed using a similar process as used to form the first and second doped lattice matching layer 220, 230. For instance, the third doped lattice matching layer 410 may be formed to a thickness of about 0.1 μm to about 0.3 μm.

Additionally, the third doped lattice matching layer 410 preferably has a dopant concentration less than the dopant concentration of the doped buried layer 310. Thus, in one example, the doped buried layer 310 may have a dopant concentration ranging from about 1E19 atoms/cm$^3$ to about 1E20 atoms/cm$^3$, and the third doped lattice matching layer 410 may have a dopant concentration ranging from about 1E17 atoms/cm$^3$ to about 1E19 atoms/cm$^3$, and preferably a dopant concentration of about 1E18 atoms/cm$^3$.

Also shown in the illustrative embodiment of FIG. 4, is a fourth doped lattice matching layer 420 formed over the third doped lattice matching layer 410. The fourth doped lattice matching layer 420 may be formed using a similar process as used to form the first, second and third doped lattice matching layers 220, 230, 410. For instance, the fourth doped lattice matching layer 420 may be formed to a thickness of about 0.1 μm to about 0.3 μm. Additionally, the fourth doped lattice matching layer 420 may be a graduated layer, similar to discussed above.

Additionally, the fourth doped lattice matching layer 420 preferably has a dopant concentration less than the dopant concentration of the third doped lattice matching layer 410. Thus, in one example, the doped buried layer 310 may have a dopant concentration ranging from about 1E19 atoms/cm$^3$ to about 1E20 atoms/cm$^3$, the third doped lattice matching layer 410 may have a dopant concentration of about 1E18 atoms/cm$^3$, and the fourth doped lattice matching layer 420 may have a dopant concentration ranging from about 1E15 atoms/cm$^3$ to about 1E17 atoms/cm$^3$.

Figure 5:
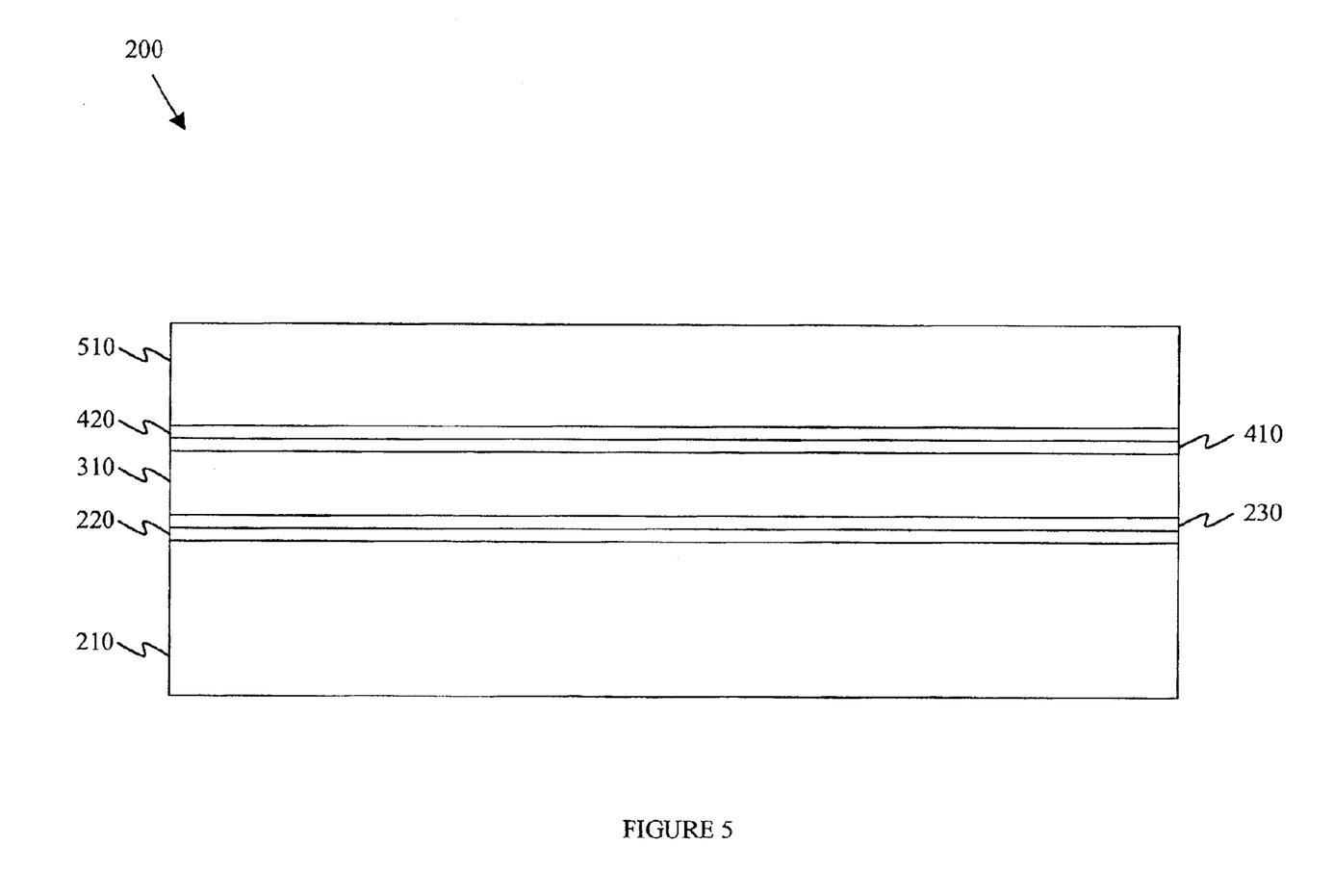
FIG. 5 illustrates a cross-sectional view of the partially completed semiconductor device illustrated in FIG. 4, after formation of a doped epitaxial layer over the doped buried layer.

Turning now to FIG. 5, illustrated is a cross-sectional view of the partially completed semiconductor device 200 illustrated in FIG. 4, after formation of a doped epitaxial layer 510 over the doped buried layer 310. In the illustrative embodiment shown in FIG. 5, the doped epitaxial layer 510 is a doped silicon layer formed on the fourth doped lattice matching layer 420. The doped epitaxial layer, which may be formed using any conventional process, including the CVD process described above, preferably has a dopant concentration less than the dopant concentration of the fourth doped lattice matching layer 420. For example, if the fourth doped lattice matching layer 420 had a dopant concentration ranging from about 1E15 atoms/cm$^3$ to about 1E17 atoms/cm$^3$, the doped epitaxial layer could have a dopant concentration of less than about 1E15 atoms/cm$^3$. Additionally, the doped epitaxial layer 510 is generally formed to a thickness ranging from about 1 μm to about 10 μm.

Figure 6:
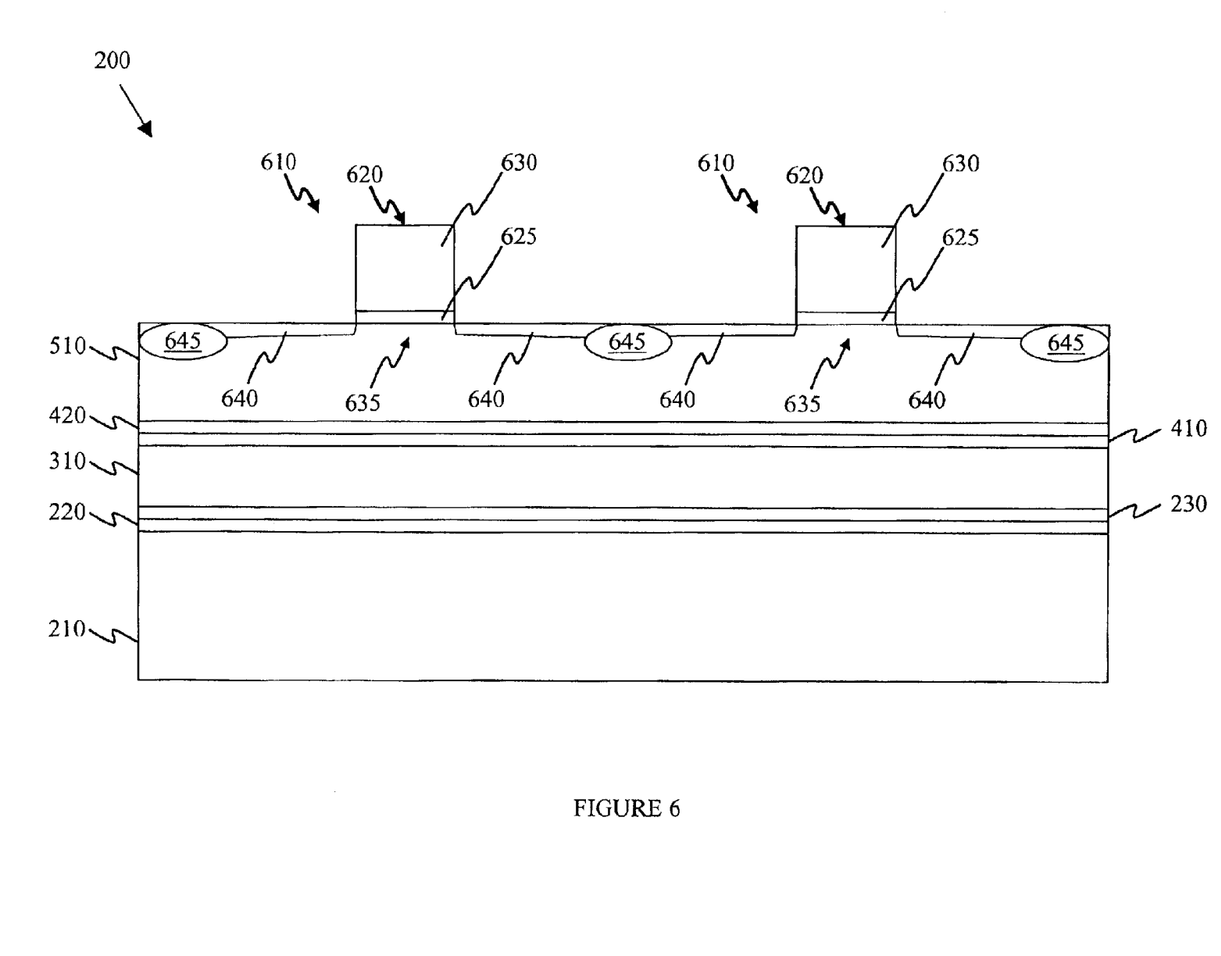
FIG. 6 illustrates a cross-sectional view of the partially completed semiconductor device illustrated in FIG. 5, after partial formation of transistors.

Turning to FIG. 6, illustrated is a cross-sectional view of the partially completed semiconductor device 200 illustrated in FIG. 5, after partial formation of transistors 610. In the illustrative embodiment shown in FIG. 6, the transistors 610 include conventionally formed transistor gates 620, each including gate oxides 625 and gate electrodes 630. The transistors 610 illustrated in FIG. 6 further include channel regions 635 and lightly doped source/drain regions 640, all of which are located in the doped epitaxial layer 510. Additionally, the semiconductor device 200 includes conventional isolation structures 645 formed between the various transistors 610. One skilled in the art understands how to form the transistors 610, therefore, the details discussion is not necessary. After completion of the semiconductor device illustrated in FIG. 6, conventional heavily doped source/drain regions are preferably formed, resulting in a device similar to the semiconductor device 100 illustrated in FIG. 1.

While only first, second, third and fourth doped lattice matching layers 220, 230, 410, 420 have been illustrated and described, one skilled in the art understands that the number of doped lattice matching layers is virtually unlimited (e.g., they can approach a continuum, as opposed to discrete steps), as long as the dopant concentrations of the various doped lattice matching layers increase as they approach the doped buried layer 310. Additionally, while a dopant type has not been given for any of the layers 220, 230, 310, 410, 420 discussed, it can generally be understood that each could contain the same type dopant as the doped substrate 210, for example boron.

The placement and use of the first and second doped lattice matching layers 120, 140, as well as the decrease in dopant concentration from the doped buried layer 130 to the first and second lattice matching layers 120, 140, helps to reduce lattice mismatch between the doped substrate 110 and the doped buried layer 130, as well as between the doped buried layer 130 and the epitaxial layer 150. This reduction in the lattice mismatch helps produce a semiconductor device 100 that does not experience many of the problems experienced by the prior art devices. More specifically, the first and second lattice matching layers 120, 140 help provide a semiconductor device that is more robust and reliable than the prior art devices.

Figure 7:
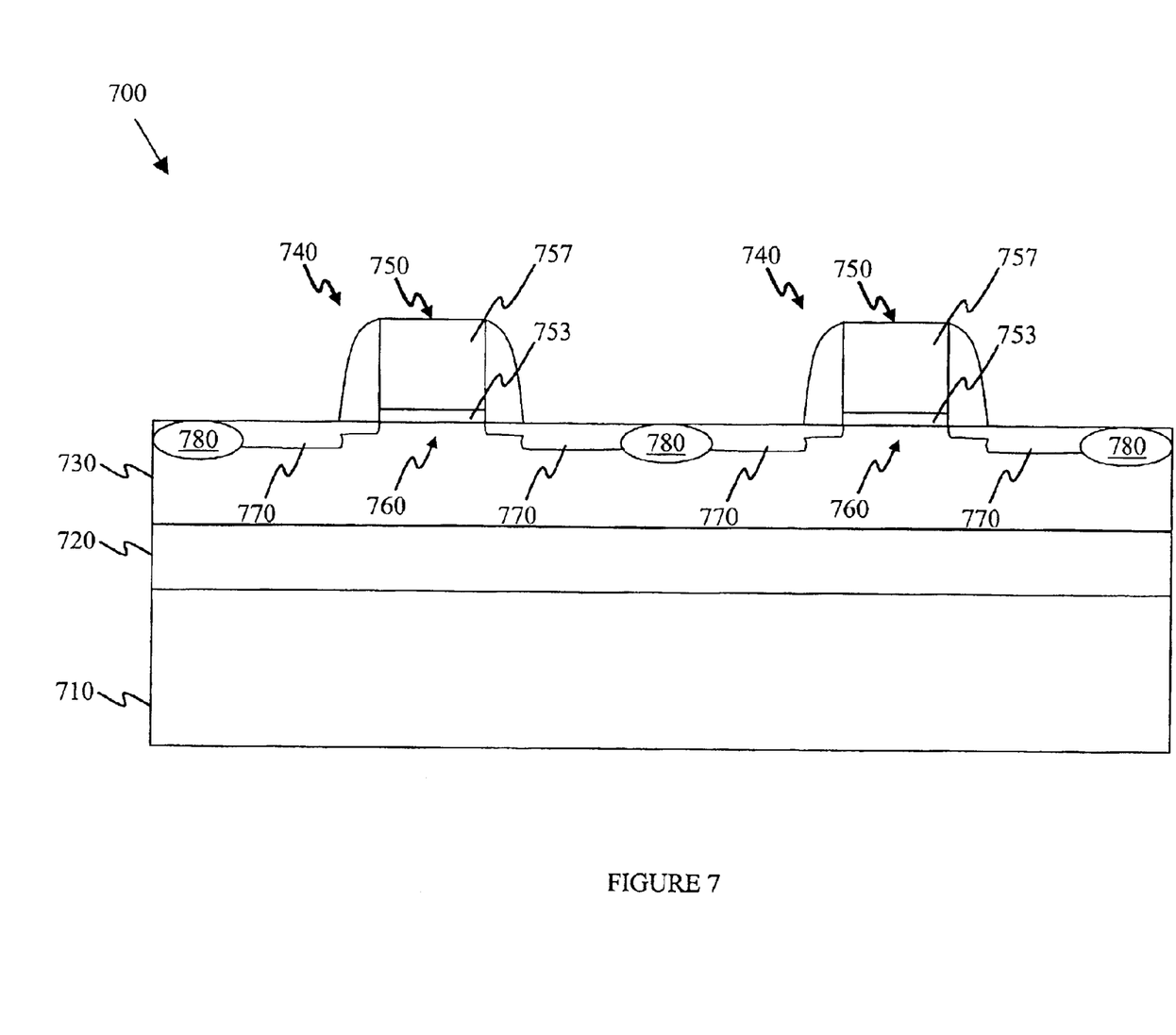
FIG. 7 illustrates a cross-sectional view of an alternative embodiment of a semiconductor device, which is in accordance with the principles of the present invention.

Turning to FIG. 7, illustrated is a cross-sectional view of an alternative embodiment of a semiconductor device 700, which is in accordance with the principles of the present invention. In the illustrative embodiment shown in FIG. 7, the semiconductor device 700 includes a co-doped germanium buried layer 720 located over a doped substrate 710. The co-doped germanium buried layer 720, in an exemplary embodiment, may have a boron dopant concentration ranging from about 1E15 atoms/cm$^3$ to about 1E21 atoms/cm$^3$, with a preferred dopant concentration of about 8E19 atoms/cm$^3$. In one embodiment, the dopant concentration may include both germanium and another p-type dopant, such as boron. Additionally, the germanium concentration in the co-doped germanium buried layer 720 may range from about 2E20 atoms/cm$^3$ to about 7E20 atoms/cm$^3$, with a preferred dopant concentration of about 5E20 atoms/cm$^3$. The co-doped germanium buried layer 720 may also have a thickness ranging from about 1 μm to about 10 μm, with a preferred thickness being about 5 μm.

The semiconductor device 700 illustrated in FIG. 7 further includes a doped epitaxial layer 730 located over the doped buried layer 720. In the illustrative embodiment shown in FIG. 7, the doped substrate 710, co-doped germanium buried layer 720 and doped epitaxial layer 730 collectively have a thickness ranging from about 2 μm to about 20 μm.

Located over the doped epitaxial layer 730 are conventional transistors 740. In the illustrative embodiment shown in FIG. 1, each of the transistors 740 includes a transistor gate 750, having a gate oxide 753 and a gate electrode 757. The transistors 740 may further include a channel region 760 located in the doped epitaxial layer 730. Additionally, the transistors 740 may include source/drain regions 770. Located between the transistors 740 are conventional isolation structures 780.

The semiconductor device 700 illustrated in FIG. 7 may be manufactured using a similar process as used to manufacture the semiconductor device 100 illustrated in FIGS. 1–6, except for the step of forming the co-doped germanium buried layer 720, which may take the place of the first and second lattice matching layers 120, 140, or be used in conjunction therewith. In an exemplary embodiment, the co-doped germanium buried layer 720 comprises silicon and is formed using a CVD process. In one exemplary embodiment, the CVD process is conducted at a temperature ranging from about 950° C. to about 1150° C. and a deposition rate ranging from about 0.1 μm to about 0.5 μm. As stated above, however, other ranges are within the scope of the present invention.

While the embodiment illustrated in FIG. 7 does not depict that first and second doped lattice matching layers may be used, one skilled in the art understands that such layers may be used as described with respect to FIGS. 1–6. If used, the first and second doped lattice matching layers may also be co-doped with germanium, or may in an alternative embodiment, only include the dopant type used in the doped substrate 710 and doped epitaxial layer 730.

The use of the co-doped germanium buried layer 720 helps to reduce lattice mismatch between the doped substrate 710 and the co-doped germanium buried layer 720, as well as between the co-doped germanium buried layer 720 and the doped epitaxial layer 730. For example, the inclusion of the germanium within the buried layer compensates for silicon lattice contraction caused by heavy boron doping, which in turn minimizes the interfacial lattice mismatch at both interfaces neighboring the co-doped germanium buried layer 720. More specifically, the co-doped germanium buried layer 720 helps provide a semiconductor device that is more robust and reliable than the prior art devices.

Figure 8:
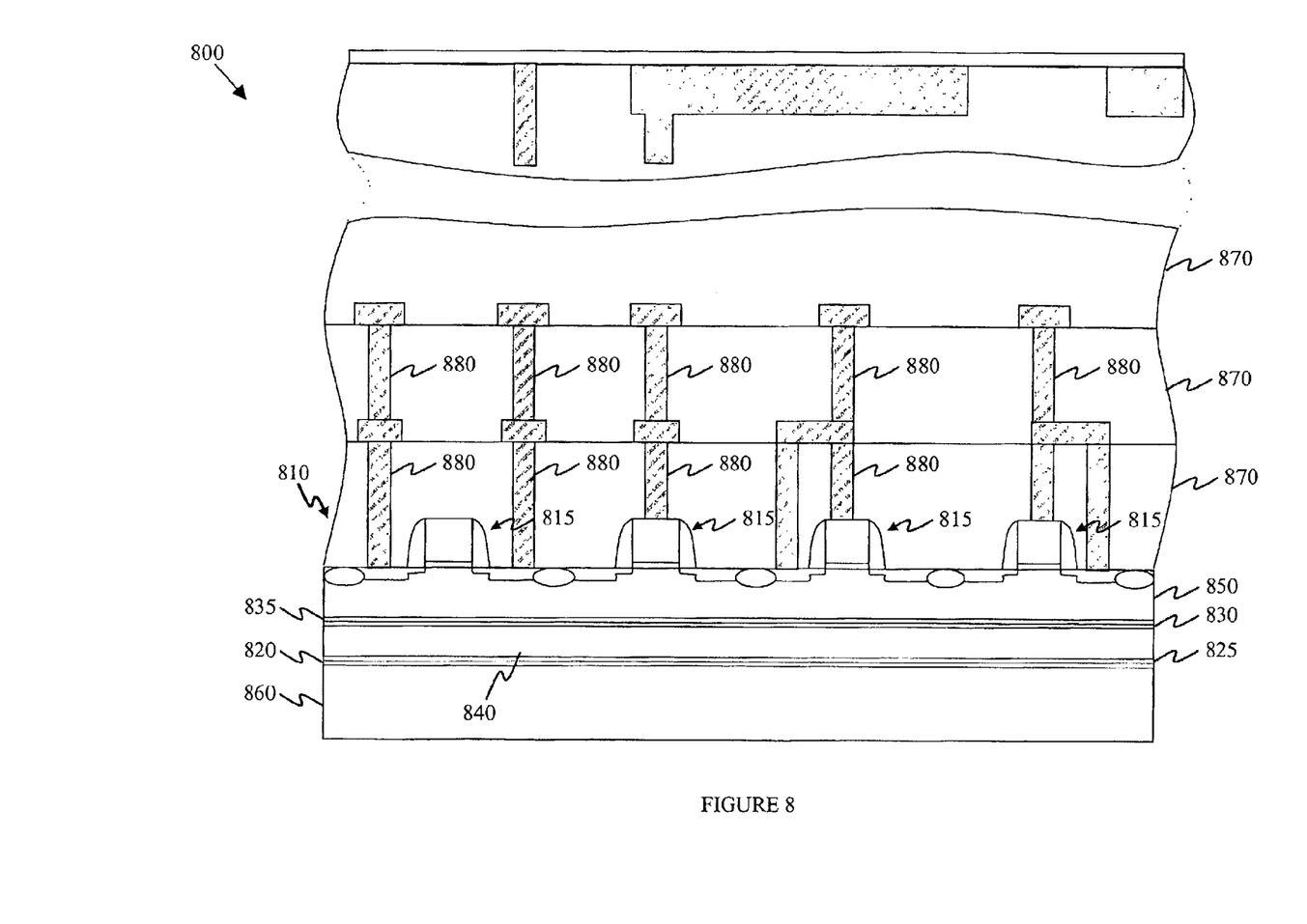
FIG. 8 illustrates a cross-sectional view of a conventional integrated circuit (IC), incorporating a device similar to the completed semiconductor device illustrated in FIG. 1.

Referring finally to FIG. 8, illustrated is a sectional view of a conventional integrated circuit (IC) 800, incorporating a semiconductor device 810 similar to the completed semiconductor device 100 illustrated in FIG. 1. The IC 800 may also include active devices, such as Bipolar devices, BiCMOS devices, memory devices, or other types of active devices. The IC 800 may further include passive devices, such as inductors or resistors, or it may also include optical devices or optoelectronic devices. Those skilled in the art are familiar with these various types of devices and their manufacture.

In the particular embodiment illustrated in FIG. 8, the IC 800 includes the semiconductor device 810 having transistors 815. As illustrated, the semiconductor device 810 includes first, second, third and fourth doped lattice matching layers 820, 825, 830, 835, a doped buried layer 840 and a doped epitaxial layer 850, all of which are formed over a doped substrate 860. The IC 800 further includes dielectric layers 870 located over the transistors 815. Additionally, interconnect structures 880, are located within the dielectric layers 870, contacting the transistors 815 to form the operational integrated circuit 800.

Although the present invention has been described in detail, those skilled in the art should understand that they can make various changes, substitutions and alterations herein without departing from the spirit and scope of the invention in its broadest form.

What is claimed is:

1. A method of manufacturing a semiconductor device, comprising:
    forming a first doped lattice matching layer over a doped substrate;
    creating a doped buried layer over the first doped lattice matching layer;
    producing a second doped lattice matching layer over the doped buried layer, the first and second doped lattice matching layers each having a dopant concentration less than a dopant concentration of the doped buried layer; and
    placing a doped epitaxial layer over the second doped lattice matching layer.

2. The method as recited in claim 1 wherein a dopant concentration of the doped substrate is less than the dopant concentration of the first doped lattice matching layer and a dopant concentration of the doped epitaxial layer is less than the dopant concentration of the second doped lattice matching layer.

3. The method as recited in claim 1 further including forming a third doped lattice matching layer between the first doped lattice matching layer and the doped buried layer and forming a fourth doped lattice matching layer over the second doped lattice matching layer.

4. The method as recited in claim 2 wherein the dopant concentration of the doped substrate ranges from about 1E14 atoms/cm$^3$ to about 1E15 atoms/cm$^3$, the dopant concentration of the doped buried layer ranges from about 1E19 atoms/cm$^3$ to about 1E20 atoms/cm$^3$, and each of the dopant concentrations of the first and second doped lattice matching layers range from about 1E15 atoms/cm$^3$ to about 1E19 atoms/cm$^3$.

5. The method as recited in claim 3 wherein a dopant concentration of the third doped lattice matching layer is greater than the dopant concentration of the first doped lattice matching layer and a dopant concentration of the fourth doped lattice matching layer is less than the dopant concentration of the second doped lattice matching layer.

6. The method as recited in claim 1 wherein the forming and producing each of the first and second doped lattice matching layers includes forming and producing a dopant gradient wherein a dopant concentration of each of the dopant gradients is greater adjacent the doped buried layer.

7. The method as recited in claim 1 wherein the forming, creating, producing, and placing, includes forming, creating, producing, and placing using a chemical vapor deposition process.

8. The method as recited in claim 7 wherein the forming, creating, producing, and placing using a chemical vapor deposition process includes forming, creating, producing, and placing in a single deposition chamber.

* * * * *